United States Patent [19]

Hunts et al.

[11] 4,055,129

[45] Oct. 25, 1977

[54] DIGITAL DIFFERENTIAL CAPACITANCE PROXIMITY SWITCH

[75] Inventors: Barney D. Hunts, Mountain Lakes, N.J.; George H. Hare, San Mateo, Calif.; Bradley Eaton, Pompton Plains, N.J.

[73] Assignee: The Singer Company, New York, N.Y.

[21] Appl. No.: 637,449

[22] Filed: Dec. 3, 1975

Related U.S. Application Data

[63] Continuation-in-part of Ser. No. 596,685, July 16, 1975, abandoned.

[51] Int. Cl.$^2$ ............................................. D05B 3/02
[52] U.S. Cl. ................................................. 112/158 E
[58] Field of Search .......... 112/158 E, 158 R, 121.11, 112/121.12; 307/116; 318/571

[56] References Cited

U.S. PATENT DOCUMENTS

| | | | |
|---|---|---|---|
| 3,568,072 | 3/1971 | Rosener | 318/571 X |
| 3,761,736 | 9/1973 | Edge et al. | 307/116 |
| 3,872,808 | 3/1975 | Wurst | 112/158 E |
| 3,943,376 | 3/1976 | Long | 307/116 |

Primary Examiner—Werner H. Schroeder
Assistant Examiner—Peter Nerbun
Attorney, Agent, or Firm—Edward L. Bell; Robert E. Smith; Edward P. Schmidt

[57] ABSTRACT

A proximity switch using logic means to detect a difference in capacitance. A bias capacitance and a sensing capacitance are charged by a first voltage source, each through one of a first pair of FET devices matched for transconductance, during a charge interval. During a detection interval the capacitances are discharged to ground potential or to a second voltage source of opposite polarity than the first voltage source, each through one of a second pair of FET devices also matched for transconductance. The difference in discharge rate between the bias and sensing capacitance, which is a measure of the capacitance of each, is detected by a cross coupled latch (RS flip-flop), setting the latch in a particular state. A second cross coupled latch stores the data thus obtained for utilization. The proximity switch circuit may be embodied as part of an MOS LSI integrated circuit, except for the bias and sensing capacitances, or may be constructed of discrete bipolar devices.

8 Claims, 6 Drawing Figures

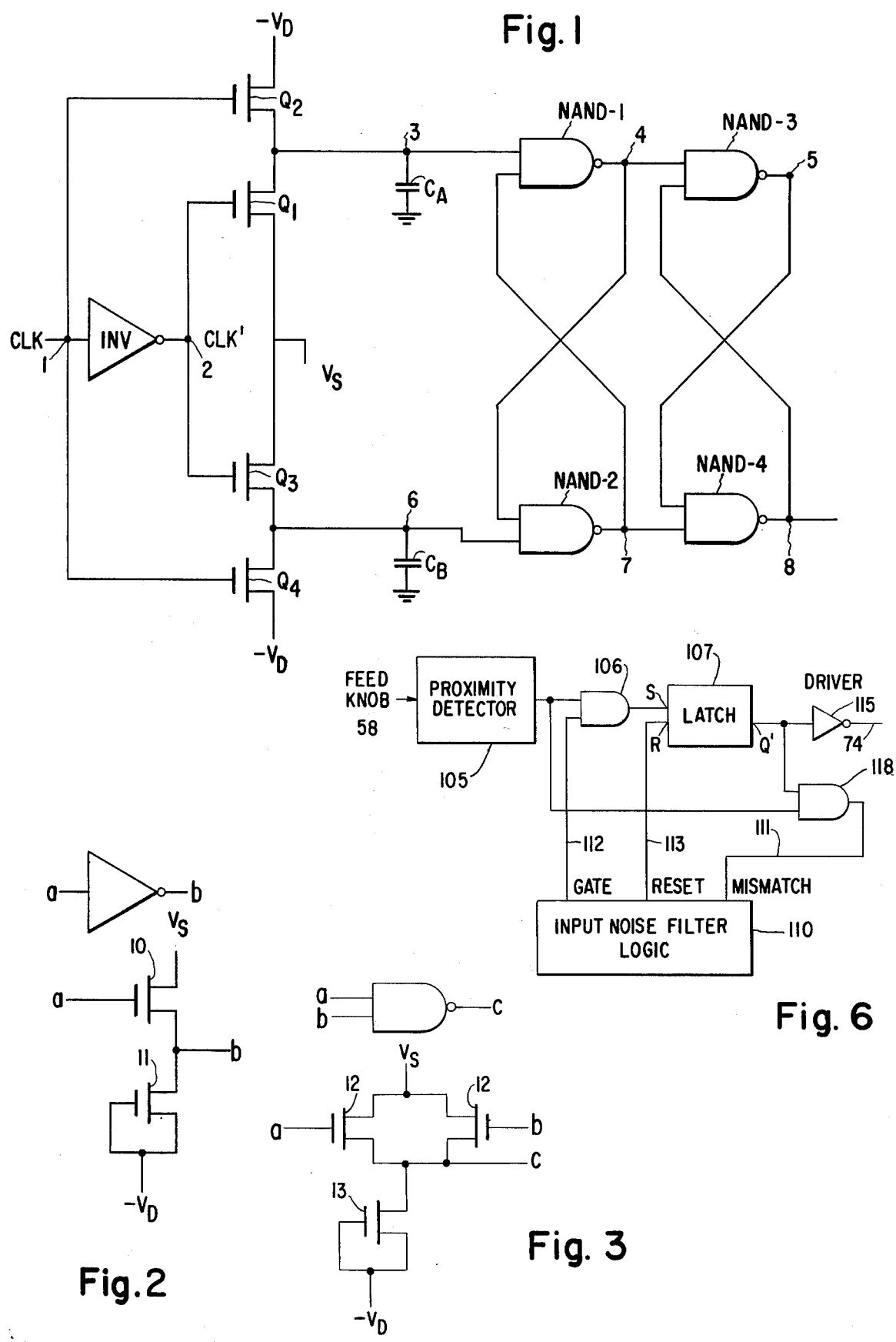

DIGITAL DIFFERENTIAL CAPACITANCE PROXIMITY SWITCH

CROSS REFERENCE TO RELATED APPLICATIONS

This is a continuation in part of the prior application Ser. No. 596,685, filed on July 16, 1975, now abandoned.

BACKGROUND OF THE INVENTION

The invention relates to a capacitance proximity switch intended primarily for manual operation by a human, but also capable of detecting objects in proximity thereto, such as moving machine parts or production items.

There is substantial body of prior art pertaining to capacitance proximity switches, including the U.S. Pat. No. 3,761,736 wherein is disclosed a differential capacitance proximity switch in a bridge circuit having self balancing capability, and the U.S. Pat. No. 3,723,885 disclosing a digital circuit capacitance proximity switch.

Also in the U.S. Pat. No. 3,796,895 is disclosed a piezoelectrically controlled solid state switching circuit using a commercially available MOSFET logic unit, having inherent high input impedance and consequent low energy dissipation.

The above and other prior art patents disclose devices requiring the use of discrete components and devices. What is required is a proximity switch device which lends itself to economical mass production without any sacrifice in performance or in reliability.

SUMMARY OF THE INVENTION

The invention provides an all electronic means of initiating a switch signal based on the sensing of a difference in capacitance, which may be implemented by discrete bipolar devices, but lends itself to incorporation as part of an MOS LSI integrated circuit. Thus a first pair of MOSFET's, matched for transconductance, are turned ON by a clock signal, one each to charge a bias capacitance and a sensing capacitance from a first voltage source. When the first pair of MOSFET's are turned OFF by the clock signal, a second pair of MOSFET's also matched for transconductance, are turned ON by an inverter connected to the clock, so that the capacitances may discharge, one each through the second pair of MOSFET's, to a ground potential or a second voltage source of opposite polarity to the first voltage source.

A detection circuit, consisting of, for example, a pair of NAND gates in cross coupled latch arrangement, is sensitive to the difference in the rate of discharge of the bias and sensing capacitance, which is a measure of the capacitance of each. Each capacitance is connected to one input of each NAND gate. The smaller capacitance would be the sensing capacitance when not touched, or not in proximity to the object to be sensed. The smaller capacitance will discharge faster and reach the threshold voltage of its NAND gate prior to the larger capacitance, switching the output of its NAND gate to a low state, thereby latching the output of the second NAND gate in a high state. A second pair of NAND gates in cross coupled latch arrangement is connected in tandem to the first pair of NAND gates and operates as a memory latch.

The NAND gates and the inverter for the clock may be implemented by MOSFET's. Thus the entire circuit with the exception of the bias capacitance and the sensing capacitance may be incorporated as part of an MOS LSI integrated circuit.

DESCRIPTION OF THE DRAWINGS

The subject matter which is regarded as the invention is particularly pointed out and distinctly claimed in the concluding portion of this specification. The invention itself, however, both as to its organization and method of operation may be best understood by reference to the following description taken in conjunction with the accompanying drawings in which:

FIG. 1 is a circuit diagram of the invention;

FIG. 2 is a circuit diagram of the inverter of FIG. 1 also shown in this FIG.;

FIG. 3 is a circuit diagram for implementation of a NAND gate in FIG. 1 also shown in this FIG.;

FIG. 6 is a schematic block of an override latch arrangement for maintaining the FET of FIG. 5 in the ON condition.

DETAILED DESCRIPTION OF THE INVENTION

Figure 4:
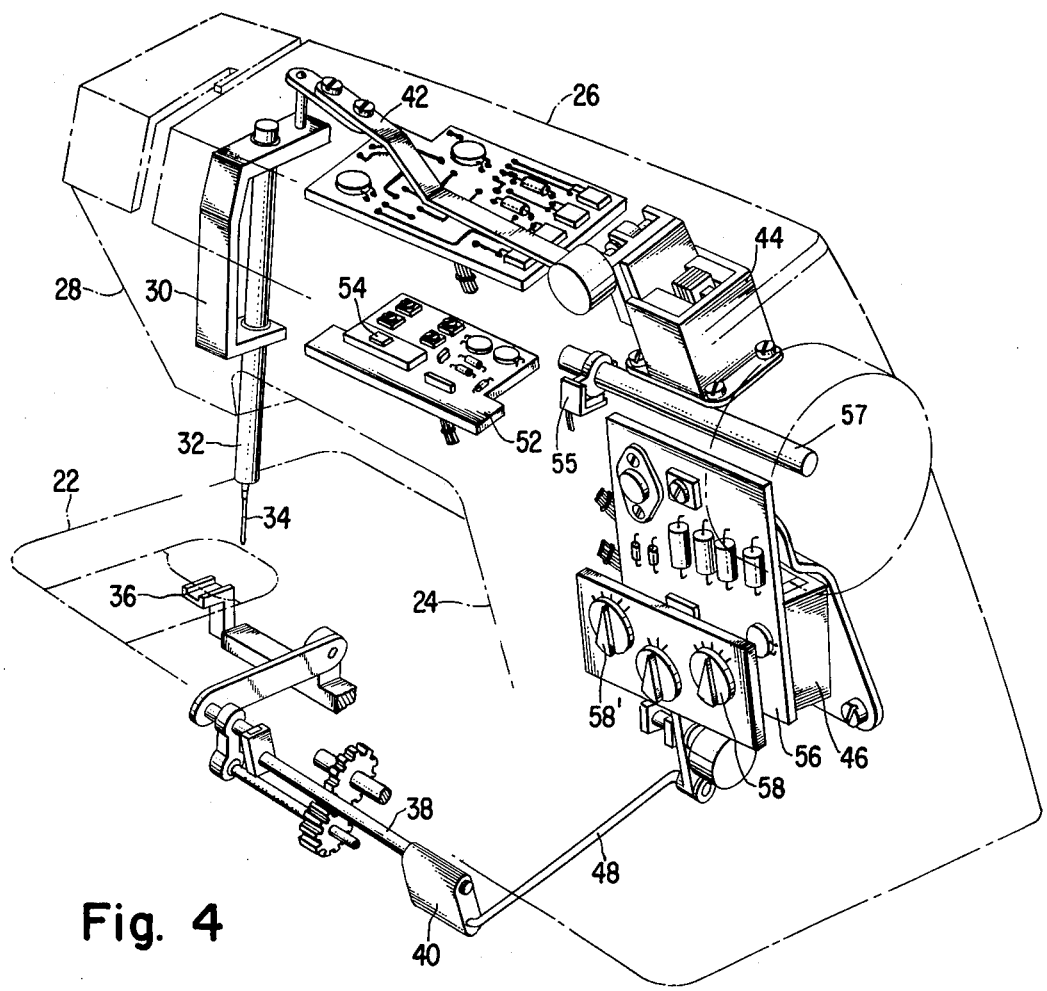
FIG. 4 is a perspective view of a sewing machine in which the invention may be utilized.

In the circuit shown in FIG. 1, MOS transistors $Q_1$ and $Q_2$ form a push-pull circuit. Transistors $Q_3$ and $Q_4$ form a similar circuit. The digital clock signal CLK and its inversion CLK' control the switching of $Q_2$, $Q_4$ and $Q_1$, $Q_3$, respectively. Transistors $Q_1$ and $Q_3$ are matched for transconductance, as are $Q_2$ and $Q_4$.

CLK is connected to node 1 as are the gates of $Q_2$ and $Q_4$ and the input to inverter INV. The output of inverter INV, CLK' on node 2, is connected to the gates of $Q_1$ and $Q_3$. The sources of $Q_1$ and $Q_3$ are connected to $V_S$, a positive potential or ground; the drains of $Q_2$ and $Q_4$ are connected to the negative supply voltage, $-V_D$. The drain of $Q_1$ and source of $Q_2$ are connected to node 3 along with capacitance $C_A$ and one input of NAND-1. The drain of $Q_3$ and source of $Q_4$ are connected to node 6 along with capacitance $C_B$ and one input of NAND-2. The output of NAND-1 (node 4) is connected to the second input of NAND-2 and the output of NAND-2 (node 7) is connected to the second input of NAND-1 to form a latch circuit. The output of NAND-1, node 4, also connects to one input of NAND-3 and the output of NAND-2, node 7, connects to one input of NAND-4. The output of NAND-3 (node 5) connects to the other input of NAND-4; and the output of NAND-4 (node 8) connects to the other input of NAND-3 to form another latch circuit which is used as logic memory, and provides the output signal for the circuit at node 8.

Capacitors $C_A$ and $C_B$ represent the total of wiring, stray, and bias capacitance, plus the sensing capacitance. Capacitor $C_B$ is assumed to contain the bias capacitance and $C_A$ is the sense capacitance to be detected.

The circuit was designed using P-channel MOS transistors where a negative voltage is the active level. The following analysis is made assuming positive logic.

The OFF condition of the switch is defined when $C_B$ is greater than $C_A$. The clock signal, CLK, is continuously running and when CLK goes low (logic "0") $Q_2$ and $Q_4$ turn ON, simultaneously charging capacitors $C_A$ and $C_B$ at nodes 3 and 6, respectively, to a negative voltage. The actual voltage is dependent on the voltage of the CLK signal and the threshold voltage of $Q_2$ and $Q_4$. At the same time, the inverter INV, generating CLK'; is high (logic "1") and holds $Q_1$ and $Q_3$ OFF. The low voltage at nodes 3 and 6 holds the output of NAND-1, and NAND-2 at nodes 4 and 7 high. The output of the memory latch (node 8) will remain at whatever state it was at previously. When CLK goes high (logic "1") $Q_2$ and $Q_4$ turn OFF, the inverter INV generates CLK' which is low (logic "0") and $Q_1$ and $Q_3$ turn ON. The voltage on nodes 3 and 6 rise at a rate determined by the amount of capacitance that is present in $C_A$ and $C_B$ and the transconductance of $Q_1$ and $Q_3$. When $C_B$ is larger then $C_A$, $C_A$ will discharge faster and thus reach the threshold voltage of NAND-1 before the voltage on $C_B$ reaches the threshold voltage of NAND-2. The inputs of NAND-1 are then both at logic "1" so its output (node 4) switches low (logic "0"), thereby latching the output of NAND-2 in the high state (logic "1"). The output of NAND-1 being low (logic "0") and NAND-2 being high (logic "1") also sets the memory latch output (node 8) low (logic "0"). This signal thus indicates logically the OFF condition of the proximity switch and the fact that $C_B$ is greater than $C_A$. Thus as long as $C_A$ is less than $C_B$ the output of NAND-2 remains high while the output of NAND-1 switches between high and low out of phase with the clock. The outputs of NAND-3 (node 5) and NAND-4 (node 8) remain high and low respectively.

In the case where additional capacitance is introduced at $C_A$ as a result of a proximity relationship to a human finger or other object to be sensed, $C_A$ is increased and is now greater than $C_B$. When CLK' turns transistors $Q_1$ and $Q_3$ ON the voltage on $C_B$ reaches the threshold of NAND-2 before the voltage on $C_A$ reaches the threshold of NAND-1. The output of NAND-2 switches low (logic "0") causing the output of NAND-1 to latch in the high state (logic "1") and also causes the memory latch output, node 8, to switch high (logic "1") indicating the ON condition of the switch and the fact that $C_A$ is greater than $C_B$.

As long as $C_A$ is greater than $C_B$ the output of NAND-1 remains high while the output of NAND-2 switches between high and low out of phase with the clock. The outputs of NAND-3 and NAND-4 remain low (logic "0") and high (logic "1") respectively.

Thus has been disclosed a simple digital differential capacity proximity switch having a charging circuit, a discharging circuit and a detection circuit composed of logic gates. FIG. 2 indicates an equivalent circuit for the inverter INV using MOS FET devices 10 and 11; and, FIG. 3 indicates an equivalent circuit for the NAND logic gates, also using MOS FET devices 12 and 13.

For best resolution of the differential capacitance, the transistors in NAND-1 and NAND-2 are matched for transconductance.

Advantages of this concept over conventional switches are that it requires no mechanical parts or mechanical motion. It is totally electronic in operation and all of the electronics except the bias capacitances can be incorporated in a monolithic MOS integrated circuit.

This method also provides fast detection, dependent on CLK frequency and transistor response.

Other methods of construction could use discrete bipolar transistors and resistors in place of the MOS circuits originally conceived. PMOS, fabrication was used in the example for purposes of simplicity. NMOS, CMOS, SOS or other device fabrication methods are equally amendable to this approach.

As will be appreciated by one skilled in the art, the transsistors $Q_2$, $Q_4$ and $Q_1$, $Q_3$, used for charging and discharging the sensing and bias capacitances, need not be matched for transconductance; nor is it required that the sensing capacitance $C_A$ be smaller than the bias capacitance $C_B$. By appropriate changes to the individual components in the various circuits differences in transconductance may be compensated for, as may be a wide range of values for the sensing capacitance and/or the bias capacitance. By adjusting the threshold level (switch point) of NAND-1 and NAND-2 many given changes or combination of changes may be accommodated, to achieve the same end result, namely, the determination of a proximity relationship to a given sensing capacitance, $C_A$. By matching the transconductance as taught and by providing for the sensing capacitance, $C_A$, to be smaller than the bias capacitance, $C_B$, the present best mode of the invention is obtained.

It will also be appreciated by one skilled in the art that by substitution of positive voltages for the negative voltages in the circuit shown in FIG. 1, detection may take place during the charge interval. Definition of charge and discharge depends on frame of reference of the user, e.g. the circuit of FIG. 1 may be designed to operate between any two supply voltages of sufficient magnitude to operate the circuit components. By the assumption of negative logic NOR gates may be utilized in place of the NAND logic elements.

In FIG. 4, there is shown a sewing machine 20 in which the invention may be utilized advantageously. Shown in planton is a sewing machine bed 22, on which is supported a standard 24 which itself supports a bracket arm 26 overhanging the bed. The bracket arm 26 terminates in a head portion 28, in which is supported a needle bar gate 30 carrying an endwise reciprocating needle bar 32. The needle bar 32 carrys at an extremity thereof a sewing needle 34 which cooperates with well known sewing instrumentalities (not shown) in the bed 22 of the sewing machine in the formation of sewing stitches. Also shown in the sewing machine bed 22 is a portion of a feed system, for the sewing work material, including a feed dog 36 and feed regulating shaft 38 with lever 40 at one end thereof.

The needle bar gate 30 may be actuated, through driving arm 42, by bight controlling linear motor 44, to cause successive needle penetrations by sewing needle 34 at various locations laterally in the production of ornamental stitches. A feed controlling linear motor 46, may, through rod 48 connected to lever 40 regulate the feed of the work material through the sewing machine, thereby to provide longitudinal variation in the production of ornamental stitches.

The bight and feed linear motors, 44 and 46, are controlled by bight and feed servo amplifier systems mounted on servo printed circuit board 50. Information is provided to the servo amplifier systems by logic circuits mounted on logic printed circuit board 52. Included on the logic p.c. board 52 is a large scale integration (LSI) integrated circuit chip 54. The LSI 54 includes a read only memory (ROM) containing the pattern stitch information for several ornamental patterns of variable bight and feed, and, may also implement the circuit of this invention shown in FIG. 1. A power supply printed circuit board 56 supports the components supplying power to the servo amplifier systems and the logic circuits; and, also supports feed and bight control knobs, 58 and 58', respectively.

Figure 5:
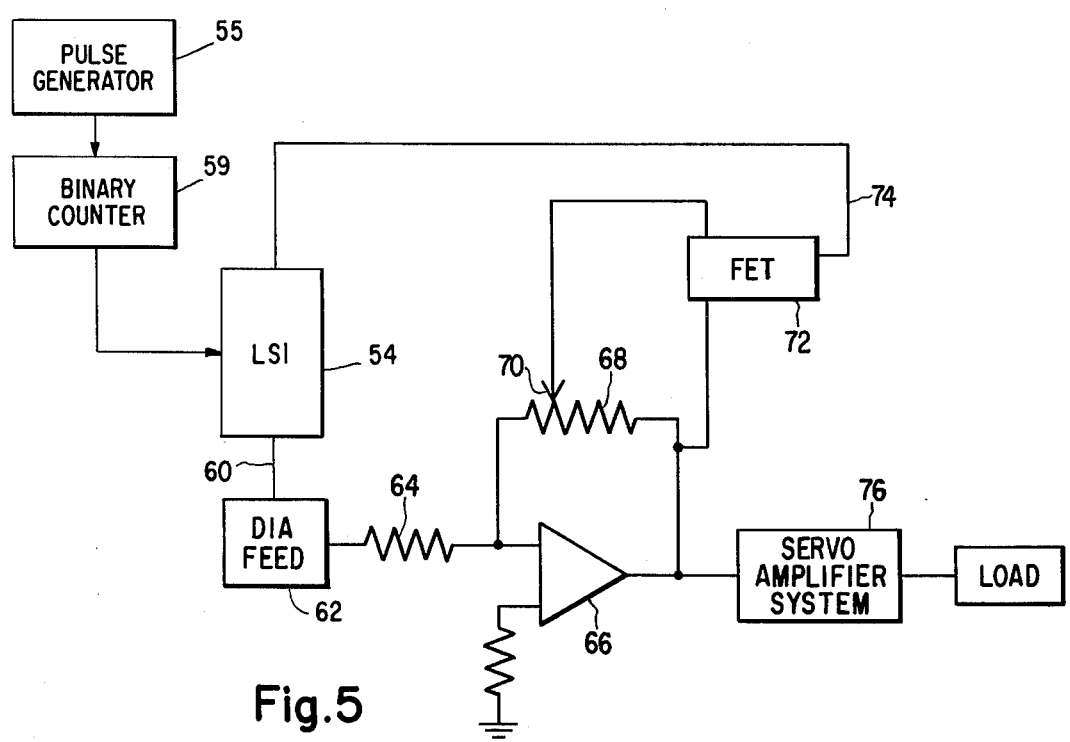
FIG. 5 is a simplified schematic block diagram, showing some circuit components, of a systems for regulating the feed of the sewing machine shown in FIG. 4.

In FIG. 5 is shown a simplified schematic block diagram, showing some circuit components, of a system for regulating the feed of the sewing machine shown in FIG. 4. A system for controlling the bight would be substantially similar with similar components having the same reference numerals primed. A pulse generator 55 (see also FIG. 4) generates pulses in timed relationship with a sewing machine arm shaft 57. The pulses so generated are counted in a binary counter 59 and presented as address inputs to the LSI 54, to recover as output therefrom pattern stitch information in digital form. More detailed information on the recovery of pattern information from a static memory may be obtained from the U.S. Pat. No. 3,855,956, assigned to the same assignee as the instant invention, which is hereby incorporated by reference herein. Thus the LSI 54 transfers digital feed pattern information along line 60 to a digital-to-analog converter for the feed, D/A feed, 62. The analog output signal of D/A feed 62 inputs to operational amplifier 66 through input resistance 64. A feedback resistance 68, is implemented by a rheostat, having a wiper 70 positioned by manipulation of knob 58. Wiper 70 is in bypass arrangement to feedback resistance 68 when FET 72 is in the conductive state depending on the state of the signal on gate line 74 to the gate of the FET from the LSI 54. By including in a portion of the LSI 54 circuits as shown in FIG. 1, wherein $C_4$ for the circuits include the capacitance of knobs 58' and 58 for bight and feed respectively, operator adjustment of knobs 58' or 58 sets the memory logic output high.

Referring to FIG. 6 there is shown a schematic block diagram of an override latch arrangement which may be implemented to retain, on operator command, the FET 72 in the ON condition for manual control of the feed signal. When the knob 58 (see FIG. 4) is touched by an operator, a proximity detector 105, of this invention, becomes active and presents an input signal to AND gate 106 and mismatch AND gate 108. If the feed override latch 107 is not set, that is the output Q' is a logical "1",the mismatch AND gate 108 outputs a signal to an input noise filter logic 110 on mismatch line 111. If the signal remains on line 111 for a period of 80–160 micro seconds, the filter logic 110 presents a pulse signal on gate line 112 to the second input of AND gate 106, thereby setting the latch 107 to output a logical "0"at Q'. The mismatch AND gate 108, having a logical "0"as an input ceases to output a signal to the filter logic 110. A driver 115, implemented by an inverter, inverts the logical "0"input to provide a control signal to FET 72 by way of gate line 74, to hold and maintain a suitable signal on the gate line 74 (or 74' for an equivalent bight adjusting circuit). The AND gates, 106 and 108, the RS latch 107, the filter logic 110 and the Drive 115 may, be known technology, be implemented as part of the LSI 54.

In this manner the gain of the operational amplifier 66, which is a function of the feedback resistance and input resistance may be varied to vary the value of the analog signal transferred from the D/A feed 62 to a feed (or bight) servo amplifier system 76. The servo amplifier system 76 responds to the value of the analog signal to position the linear motor 46 to a specific position related to the analog signal.

A more complete exposition of the feed and bight control system may be had by reference to the United States patent application Ser. No. 596,683, entitled "Electronic Control of Bight, Feed and Feed Balance In A Sewing Machine", filed on July 16, 1975, assigned to the same assignee as the present invention, which is hereby incorporated by reference herein.

Numerous alterations of the structure herein disclosed will suggest themselves to those skilled in the art. However, it is to be understood that the present disclosure relates to a preferred embodiment of the invention which is for purposes of illustration only and not to be construed as a limitation of the invention. All such modifications which do not depart from the spirit of the invention are intended to be included within the scope of the appended claims.

What is claimed is:

1. In a sewing machine having stitch-forming instrumentalities positionally controlled over a predetermined range between stitches to produce a pattern of feed and bight controlled stitches; logic means for storing pattern stitch information in digital form; means operating in timed relation with the sewing machine for recovering selected digital pattern stitch information from said logic means; feed and bight digital-to-analog converter means for generating positional feed and bight analog signals, respectively, related to said selected digital pattern stitch information; and feed and bight closed loop servo means including reversible electric motors responsive to said feed and bight analog signals, respectively, for positioning said stitch-forming instrumentalities to produce a pattern of stitches corresponding to the selected digital pattern stitch information, signal control operational amplifier means interposed between said feed and bight digital-to-analog converter means and said feed and bight closed loop servo means, respectively, each of said operational amplifier means having a feedback circuit including a rheostat, switch means effective on operator command to insert a wiper on said rheostat in bypass arrangement in said feedback circuits, whereby the gain of said operational amplifier means may be varied to vary the analog signal received from said feed and bight digital-to-analog converter means and transferred, respectively, to said feed and bight closed servo means;

wherein the improvement comprises: a differential capacitance proximity switch, said proximity switch having a bias capacitance, a sensing capacitance including a knob operatively connected to said wiper, said sensing capacitance being smaller than said bias capacitance when not augumented by proximity relationship, means for charging and discharging said capacitances, means for detecting the discharge rates of said bias and sensing capacitances, said detecting means having a first response when said sensing capacitance has a faster discharge rate than said bias capacitance, said detecting means having a second response when said sensing capacitance has a slower discharge rate than said bias capacitance; and, means for rendering said switch means effective when said detecting means generates said second response.

2. In a sewing machine having stitch-forming instrumentalities positionally controlled over a predetermined range between stitches to produce a pattern of feed and bight controlled stitches; logic means for storing pattern stitch information in digital form; means operating in timed relation with the sewing machine for recovering selected digital pattern stitch information from said logic means; feed and bight digital-to-analog converter means for generating positional feed and bight analog signals, respectively, related to said selected digital pattern stitch, information; and feed and bight closed loop servo means including reversible electric motors responsive to said feed and bight analog signals, respectively, for positioning said stitch-forming instrumentalities to produce a pattern of stitches corresponding to the selected digital pattern stitch information; wherein the improvement comprises:

signal control operational amplifier means interposed between said feed and bight digital-to-analog converter means and said feed and bight closed loop servo means, respectively, each of said operational amplifier means having a feedback circuit including a rheostat;

switch means effective on operator command to insert a wiper on said rheostat in bypass arrangement in said feedback circuits, whereby the gain of said operational amplifier means may be varied to vary the analog signal received from said feed and bight digital-to-analog converter means and transferred, respectively, to said feed and bight closed loop servo means;

wherein the improvement comprises:

a digital differential capacitance proximity switch having a charging circuit, a discharging circuit, and a detection circuit, said charging circuit comprising: a bias capacitance, a sensing capacitance including a knob operatively connected to said wiper, said sensing capacitance being smaller than said bias capacitance when not augmented by proximity relationship, a clock, a first voltage source, a first pair of FET means matched for transconductance and turned on by said clock one each for charging said bias capacitance and said sensing capacitance from said first voltage source; said discharging circuit comprising an inverter for said clock, a second voltage source of opposite polarity to said first voltage source and including ground potential, a second pair of FET means matched for transconductance and turned on by said inverter one each for discharging said bias capacitance and said sensing capacitance to said second voltage source; said detection circuit comprising logic means having a first response when said sensing capacitance is smaller than said bias capacitance, and a second response when said sensing capacitance is larger than said bias capacitance; and, means for rendering said switch means effective when said detecting means generates said second response.

3. In a sewing machine having stitch-forming instrumentalities positionally controlled over a predetermined range between stitches to produce a pattern of feed and bight controlled stitches; logic means for storing pattern stitch information in digital form; means operating in timed relation with the sewing machine for recovering selected digital pattern stitch information from said logic means; feed and bight digital-to-analog converter means for generating positional feed and bight analog signals, respectively, related to said selected digital pattern stitch information; and feed and bight closed loop servo means including reversible electric motors responsive to said feed and bight analog signals, respectively, for positioning said stitch-forming instrumentalities to produce a pattern of stitches corresponding to the selected digital pattern stitch information; wherein the improvement comprises:

signal control operational amplifier means interposed between said feed and bight digital-to-analog converter means and said feed and bight closed loop servo means, respectively, each of said operational amplifier means having a feedback circuit including a rheostat;

switch means effective on operator command to insert a wiper on said rheostat in bypass arrangement in said feedback circuits, whereby the gain of said operational amplifier means may be varied to vary the analog signal received from said feed and bight digital-to-analog converter means and transferred, respectively, to said feed and bight closed loop servo means;

wherein the improvement comprises:

A digital differential capacitance proximity switch having a charging circuit, a discharging circuit, and a detection circuit, said charging circuit comprising; a bias capacitance, a sensing capacitance including a knob operatively connected to said wiper, said sensing capacitance being smaller than said bias capacitance when not augmented by proximity relationship, a clock, a first voltage source, a first pair of FET means matched for transconductance and turned on by said clock one each for charging said bias capacitance and said sensing capacitance from said first voltage source; said discharging circuit comprising an inverter for said clock, a second voltage source of opposite polarity to said first voltage source and including ground potential, a second pair of FET means matched for transconductance and turned on by said inverter one each for discharging said bias capacitance and said sensing capacitance to said second voltage source; said detection circuit comprising logic means responsive to the discharge rate of said capacitances and having a first response when said sensing capacitance has a faster discharge rate than said bias capacitance and a second response when said sensing capacitance has a slower discharge rate than said bias capacitance; and, means for rendering said switch means effective when said detecting means generates said second response.

4. In a sewing machine as claimed in claim 3 wherein said proximity switch logic means includes a first pair of logic gates in cross coupled latch arrangement, a first of such first pair of logic gates having an input connected to said sensing capacitance, and a second of said first pair of logic gates having an input connected to said bias capacitance, whereby the discharge rates of said capacitances are compared by said first pair of logic gates.

5. In a sewing machine as claimed in claim 4 wherein said first pair of logic gates in cross coupled latch arrangement are matched for transconductance.

6. In a sewing machine as claimed in claim 5 wherein said logic means further includes a second pair of logic gates in cross coupled latch arrangement, said second pair of logic gates connected in tandem to said first pair of logic gates and serving as a memory latch therefor; said memory latch having a first response when said sensing capacitance has a faster discharge rate than said bias capacitance, and a second response when said sensing capacitance has a slower discharge rate than said bias capacitance.

7. In a sewing machine as claimed in claim 6 wherein said proximity switch first pair and said second pair of FET means are MOSFET's, part of an MOS LSI integrated circuit; and said first pair and said second pair of logic gates and said inverter are implemented by MOSFET's, part of an MOS LSI integrated circuit, whereby said entire proximity switch exclusive of the bias capacitance and sensing capacitance may be implemented as part of an MOS LSI integrated circuit.

8. In a sewing machine having stitch-forming instrumentalities positionally controlled over a predetermined range between stitches to produce a pattern of feed and bight controlled stitches; logic means for storing pattern stitch information in digital form; means operating in timed relation with the sewing machine for recovering selected digital pattern stitch information from said logic means; feed and bight digital-to-analog converter means for generating positional feed and bight analog signals, respectively, related to said selected digital pattern stitch information; and feed and bight closed loop servo means including reversible electric motors responsive to said feed and bight analog signals, respectively, for positioning said stitch-forming instrumentalities to produce a pattern of stitches corresponding to the selected digital pattern stitch information, signal control operational amplifier means interposed between said feed and bight digital-to-analog converter means and said feed and bight closed loop servo means, respectively, each of said operational amplifier means having a feedback circuit including a rheostat, switch means effective on operator command to insert a wiper on said rheostat in bypass arrangement in said feedback circuits, whereby the gain of said operational amplifier means may be varied to vary the analog signal received from said feed and bight digital-to-analog converter means and transferred, respectively, to said feed and bight closed servo means;

wherein the improvement comprises: a differential capacitance proximity switch, said proximity switch having a bias capacitance, a sensing capacitance including a knob operatively connected to said wiper, means for charging and discharging said capacitance in phase with each other, means for detecting a change in the relative value of said bias and sensing capacitances, said detecting means having a first response when said sensing capacitance is not augmented by a proximity relationship, said detecting means having a second response when said sensing capacitance is augmented by a proximity relationship, and, means for rendering said switch means effective when said detecting means generates said second response.

* * * * *